United States Patent
Park et al.

(10) Patent No.: US 7,733,715 B2
(45) Date of Patent: Jun. 8, 2010

(54) MEMORY SYSTEM, MEMORY DEVICE, AND OUTPUT DATA STROBE SIGNAL GENERATING METHOD

(75) Inventors: Kwang-Il Park, Yongin-si (KR);
Seong-Jin Jang, Seongnam-si (KR);
Ho-Young Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 12/071,347

(22) Filed: Feb. 20, 2008

(65) Prior Publication Data

US 2008/0144406 A1 Jun. 19, 2008

Related U.S. Application Data

(62) Division of application No. 11/251,787, filed on Oct. 18, 2005, now Pat. No. 7,362,648.

(30) Foreign Application Priority Data

Oct. 19, 2004 (KR) ................. 2004-83745

(51) Int. Cl.
*G11C 7/00* (2006.01)
(52) U.S. Cl. ............... 365/193; 365/230.03; 365/191
(58) Field of Classification Search .............. 365/193, 365/230.03, 191, 233, 185.22, 189.07, 189.03, 365/185.2, 212
See application file for complete search history.

(56) References Cited

U.S. PATENT DOCUMENTS

| 5,896,347 | A | 4/1999 | Tomita et al. |
| 6,215,710 | B1 | 4/2001 | Han et al. |
| 6,321,343 | B1 | 11/2001 | Toda |
| 6,557,071 | B2 | 4/2003 | Stolt et al. |
| 6,570,815 | B2 | 5/2003 | Kashiwazaki |
| 7,230,466 | B2 | 6/2007 | Park |
| 2004/0022088 | A1 | 2/2004 | Schaefer |

(Continued)

FOREIGN PATENT DOCUMENTS

KR 12003-0078307 10/2003

(Continued)

OTHER PUBLICATIONS

Taiwan Notice of Allowability with Search Report completed on Jun. 15, 2007 and issued in corresponding Taiwan Patent Application No. 94136509.

(Continued)

*Primary Examiner*—Dang T Nguyen
(74) *Attorney, Agent, or Firm*—Harness, Dickey & Pierce, P.L.C.

(57) ABSTRACT

An output data strobe signal generating method and a memory system that includes a plurality of semiconductor memory devices, and a memory controller for controlling the semiconductor memory devices, wherein the memory controller provides a command signal and a chip selecting signal to the semiconductor memory devices. One or more of the semiconductor memory devices may detect a read command and a dummy read command in response to the command signal and the chip selecting signal and generate one or more preamble signals based on a calculated preamble cycle number.

18 Claims, 11 Drawing Sheets

U.S. PATENT DOCUMENTS

2005/0068812 A1* 3/2005 Oh .............................. 365/193
2005/0114326 A1* 5/2005 Smith et al. .................... 707/3

FOREIGN PATENT DOCUMENTS

| KR | 2003-0091233 | 12/2003 |
|---|---|---|
| TW | 530207 | 4/2003 |

OTHER PUBLICATIONS

JEDEC Standard JESD79, "DDR SDRAM Specification," Jun. 2000.
German Office Action issued in corresponding German Application No. 10 2005 051 206.2 on Dec. 12, 2007.

* cited by examiner

MEMORY SYSTEM, MEMORY DEVICE, AND OUTPUT DATA STROBE SIGNAL GENERATING METHOD

CROSS-REFERENCE TO RELATED APPLICATIONS PRIORITY

This is a divisional application of U.S. patent application Ser. No. 11/251,787, filed Oct. 18, 2005 now U.S. Pat. No. 7,362,648 application which claims the benefit of Korean Patent Application No. 2004-83745, filed Oct. 19, 2004, the entire contents of which are herein incorporated by reference.

BACKGROUND OF THE INVENTION

1. Field of the Invention

Example embodiments of the present invention relate to a memory system and semiconductor memory device which generates an output data strobe signal having a preamble signal and a method for generating an output data strobe signal.

2. Description of the Related Art

Conventionally, a memory system may include a memory controller and a semiconductor memory device. Input/output data strobe signals may be generated together with data to provide accurate timing of input/output data during a data transmission between a memory controller and a semiconductor memory device.

For example, in a double data rate, quadruple data rate, etc., semiconductor device, data input/output may be performed in synchronization with a rising edge and/or falling edge of a clock signal. The input/output data strobe signals may be generated in synchronization with a clock signal. The semiconductor device may receive sampled input data with the input data strobe signal during a write operation and may output data with an output data strobe signal during a read operation.

However, as operation speed of the memory system increases, a frequency of the clock signal may increase, and thus the output data strobe signal which may be generated in synchronization with the clock signal and may be generated during a read operation may not swing stably from a first output voltage to a second output voltage during an initial generating stage. As a result, the output data strobe signal and the data which are generated initially may not coincide.

Due in part to the forgoing, a semiconductor memory device may generate a preamble signal during a predetermined cycle (fixed, for example) before generating a strobe signal of the output data strobe signal, thereby possibly providing stable swing during the initial stage of strobe signal generation. As a result, generation timing between the output data strobe signal and transmitted data may coincide. The preamble signal may be synchronous with the clock signal before the strobe signal of the output data strobe signal is generated. However, the initially generated preamble signal may not be synchronous with the clock signal due to an unstable swing and may be toggled during a predetermined cycle (fixed, for example) to gradually become synchronous with the clock signal.

The memory controller may be connected to a plurality of semiconductor memory devices and an output data strobe signal line may be commonly connected to an output data line. If a cycle number of the preamble signal of the data strobe signal of a plurality of semiconductor memory devices is fixed, a problem may occur because the read operation of a first semiconductor memory device may be performed immediately or approximately immediately after read operation of a second semiconductor memory device. Because the preamble signal of the output data strobe signal may be generated from the second semiconductor memory device while the strobe signal of the output data strobe signal may be generated from the first semiconductor memory device, a collision may occur between the strobe signal of the first semiconductor device and the preamble signal of the output data strobe signal of the second semiconductor device.

SUMMARY OF THE INVENTION

Example embodiments of the present invention may provide a memory system which may reduce or prevent collisions between a strobe signal generated from one semiconductor memory device and a preamble signal generated from another semiconductor memory device during read operation of a plurality of semiconductor memory devices.

Example embodiments of the present invention may provide a semiconductor memory device which may vary a preamble signal of an output data strobe signal.

Example embodiments of the present invention may provide an output data strobe signal generating method of a memory system and/or semiconductor memory device.

An example embodiment of a memory system of the present invention may include a plurality semiconductor memory devices; and a memory controller configured to control the plurality of semiconductor memory devices, wherein the memory controller may be configured to provide a command signal and a chip selecting signal to the plurality of semiconductor memory devices, and output an output data strobe signal of the plurality of semiconductor memory devices.

In an example embodiment of the memory system, one or more of the semiconductor memory devices may be configured to detect a read command in response to the command signal and the chip selecting signal and generate preamble signals based on the calculated preamble cycle number.

In an example embodiment of the memory system of the present invention, the calculated preamble cycle number may be calculated by subtracting a cycle number corresponding to a burst length from a cycle number representing the number of cycles occurring between the dummy read command and the read command.

An example embodiment of a semiconductor memory device of the present invention may include a command decoder configured to decode a read signal, a dummy read signal, and a mode setting signal; a mode setting portion configured to set a burst length signal and a CAS latency signal in response to the mode setting signal; and a preamble cycle calculator configured to generate a preamble cycle signal based on the calculated preamble cycle number.

An example embodiment of an output data strobe signal generating method of a memory system including at least two semiconductor memory devices, and a memory controller controlling the plurality of semiconductor memory devices according to the present invention may include: applying a command signal and a chip selecting signal to the semiconductor memory devices; detecting a read command and a dummy read command in response to the command signal and the chip selecting signal; calculating a preamble cycle number; and generating at least one preamble signal based on the calculated preamble cycle number.

An example embodiment of an output data strobe signal generating method of a semiconductor memory device according to the present invention may include: generating a read signal, a dummy read signal, and a mode setting signal in response to a command signal and a chip selecting signal;

setting a burst length signal, a CAS latency signal and a preamble cycle signal in response to the mode setting signal; calculating a preamble cycle number; and generating a preamble cycle signal based on the calculated preamble cycle number.

It is to be understood that both the foregoing general description of example embodiments of the present invention and the following detailed description of example embodiments of the present invention are not intended to be restrictive of the present invention.

BRIEF DESCRIPTION OF THE DRAWINGS

Example embodiments of the present invention will become more apparent and more readily appreciated from the following description of example embodiments of the present invention taken in connection with the accompanying figures.

DESCRIPTION OF EXAMPLE EMBODIMENTS OF THE PRESENT INVENTION

Example embodiments of the present invention will now be described more fully with reference to the accompanying figures. The present invention may, however, be embodied in different forms and should not be construed as limited to the example embodiments set forth herein. Rather, the example embodiments are provided to convey the scope of the invention to those skilled in the art.

Figure 1:
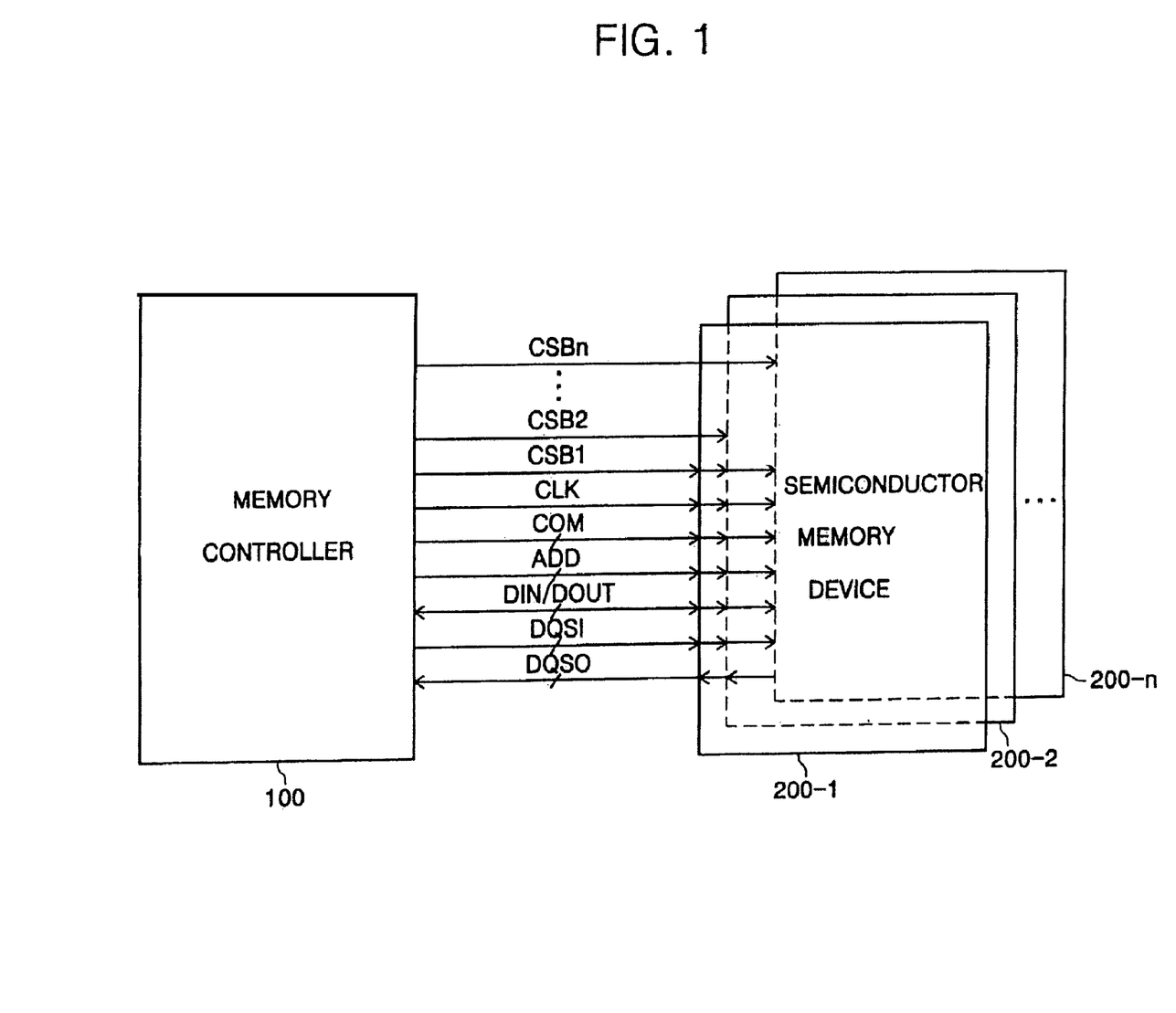
FIG. 1 is a block diagram of an example embodiment of a memory system according to the present invention.

FIG. 1 is a block diagram illustrating an example embodiment of a memory system according to the present invention. An example embodiment of a memory system, as illustrated in FIG. 1, may include a memory controller 100 and n semiconductor memory devices 200-1 to 200-n.

An example embodiment of a memory controller 100 may output one or more of the following: chip selecting signals CSB1 to CSBn; a clock signal CLK; a command signal COM; an address signal ADD; an input data signal DIN; and an input data strobe signal DQSI. The chip selecting signals CSB1 to CSBn may be inverted. An example embodiment of the memory controller 100 may receive an output data signal DOUT and/or an output data strobe signal DQSO. The example embodiments of the n semiconductor memory devices 200-1 to 200-n may receive a common clock signal CLK, command signal COM, address signal ADD, input data signal DIN, and/or input data strobe signal DQSI. The example embodiments of the n semiconductor memory devices 200-1 to 200-n may each receive different inverted chip selecting signals CSB1 to CSBn. Each of the example embodiments of the n semiconductor memory devices 200-1 to 200-n may output the output data strobe signal DQSO and/or the output data signal DOUT.

In an example embodiment shown in FIG. 1, an example embodiment of the memory system of the present invention may select one of the n semiconductor memory devices 200-1 to 200-n based on the chip selecting signals CSB1 to CSBn (for example). An example embodiment of the memory system may also perform a write operation and/or read operation for a selected one of the semiconductor memory devices 200-1 to 200-n in response to any one, or combination, of the clock signal CLK, the command signal COM and the address signal ADD.

Figure 2:
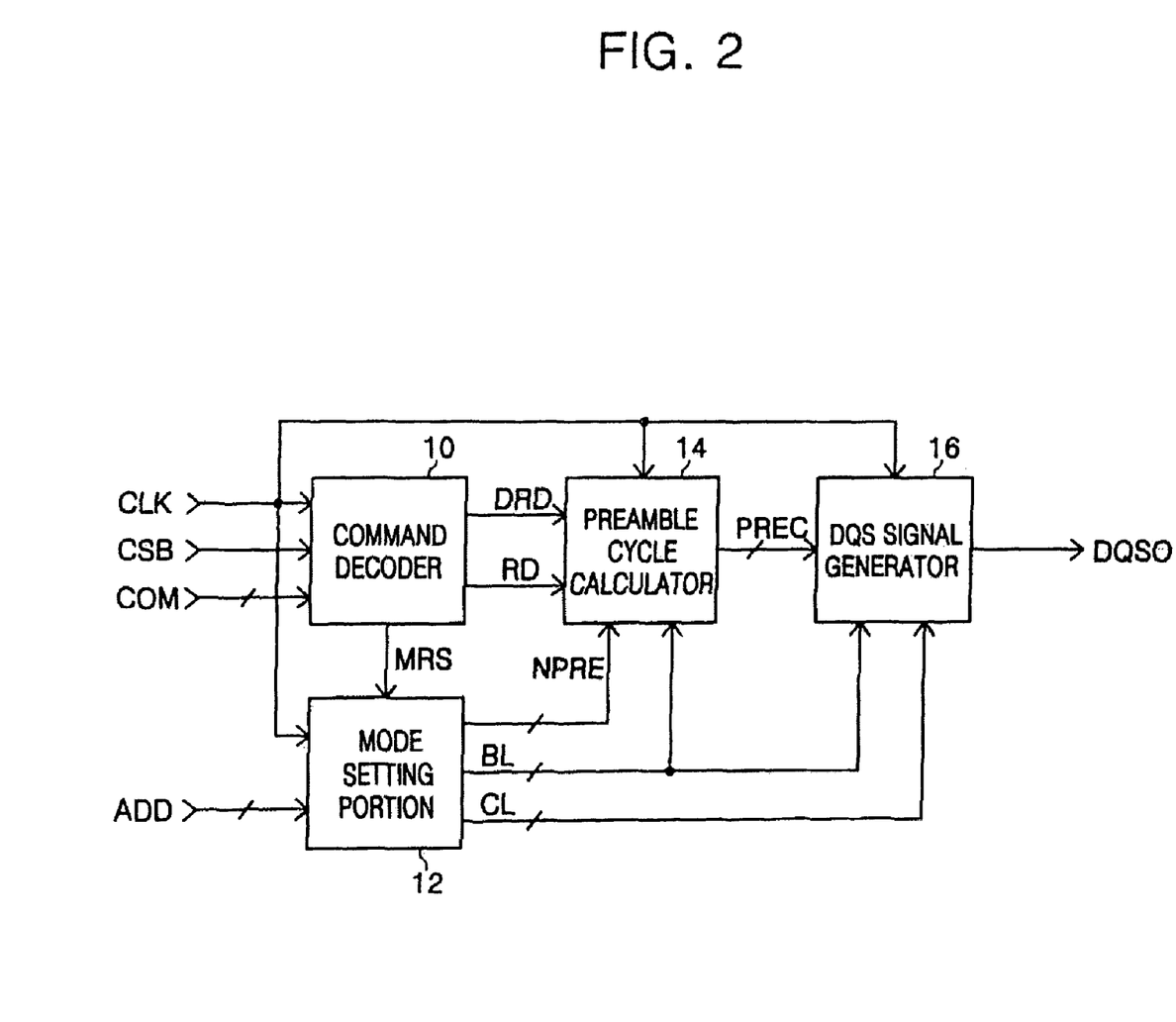
FIG. 2 is a block diagram of an example embodiment of a semiconductor memory device of the example embodiment of the memory system of FIG. 1.

FIG. 2 is a block diagram illustrating an example embodiment of the semiconductor memory device of an example embodiment of the memory system of FIG. 1. FIG. 2 shows components that may relate to generating an output data strobe signal DQSO. As shown in FIG. 2, an example embodiment of the semiconductor memory device may include a command decoder 10, a mode setting portion 12, a preamble cycle calculator 14, and/or an output data strobe signal generator 16.

An example embodiment of the command decoder 10 may receive and decode a chip selecting signal CSB and/or the command signal COM to generate at least one of a dummy read signal DRD, a read signal RD, and a mode setting signal MRS in response to the clock signal CLK.

An example embodiment of a mode setting portion 12 may receive and decode an address signal ADD to generate at least one of a burst length signal BL, a CAS latency signal CL, and a maximum preamble cycle signal NPRE in response to the mode setting signal MRS. The address signal ADD, which may be applied in response to the mode setting signal MRS, may be a mode setting code. The maximum preamble cycle signal NPRE may represent a maximum preamble cycle number. The burst length signal BL may be a signal which designates a burst length, and the CAS latency signal CL may be a signal which designates a CAS latency. For example, an example embodiment of the mode setting portion 12 may set the burst length signal BL4 to a high level if a mode setting code corresponding to a burst length four is input and may set a burst length signal BL8 to a high level if a mode setting code corresponding to a burst length eight is input. Alternatively, an example embodiment of the mode setting portion 12 may be configured to set the burst length signal BL4 to a low level when a mode setting code corresponding to a burst length four is input and may be configured to set a burst length signal BL8 to a low level if a mode setting code corresponding to a burst length eight is input. One or more of the maximum preamble cycle number, burst length, and CAS latency may be varied from device to device or system to system based on design preferences.

An example embodiment of the preamble cycle calculator 14 may receive at least one of a dummy read signal DRD, a read signal RD, a maximum preamble cycle signal NPRE, and a burst length signal BL and may calculate a preamble cycle number that may be used to generate a preamble cycle signal PREC. The preamble cycle calculator 14 may calculate a preamble cycle number by subtracting a cycle number approximately corresponding to the burst length from a cycle number approximately corresponding to the number of cycles between the dummy read signal DRD and the read signal RD.

Calculating the preamble cycle number by subtracting a cycle number approximately corresponding to the burst length from a cycle number approximately corresponding to the number of cycles between the dummy read signal DRD and the read signal RD is just one example embodiment of how to calculate the preamble cycle number and it should be understood that the above calculating method is not intended to restrict the present invention.

The calculated preamble cycle number may be used to generate the preamble cycle signal PREC. An example embodiment of the present invention may be configured such that the calculated preamble cycle number may not exceed a maximum preamble cycle number (e.g., a preamble cycle threshold).

An example embodiment of the output data strobe signal generator 16 may receive at least one of the preamble cycle number PREC, the burst length signal BL, and the CAS latency signal CL to generate the output data strobe signal DQSO. An example embodiment of the output data strobe signal generator 16 may generate preamble signals with a number of cycles approximately corresponding to the calculated preamble cycle number and may generate strobe signals with a number of cycles approximately corresponding to the burst length. After the read command is applied, the generated strobe signal may be delayed during a cycle corresponding to the CAS latency and may be generated in synchronization with the clock signal CLK.

Figure 3:
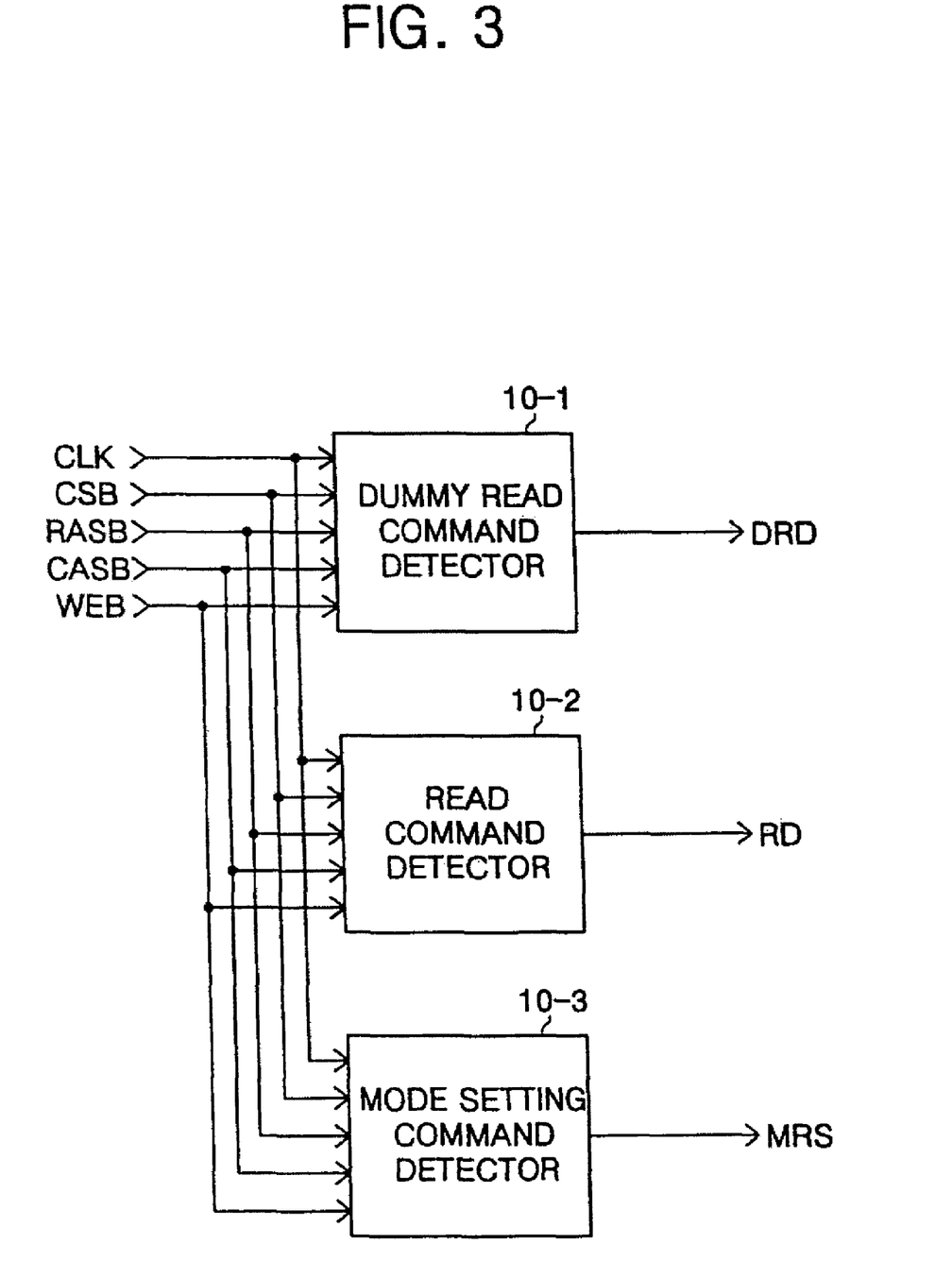
FIG. 3 is a block diagram of an example embodiment of a command decoder of the example embodiment of the semiconductor memory device of FIG. 2.

FIG. 3 is a block diagram illustrating an example embodiment of the command decoder of an example embodiment of the semiconductor memory device of FIG. 2. An example embodiment of the command decoder of FIG. 3 may include a dummy read command detector 10-1, a read command detector 10-2, and/or a mode setting command detector 10-3.

An example embodiment of the dummy read command detector 10-1 may generate the dummy read signal DRD based on at least one of a chip selecting signal CSB, a row address strobe signal RASB, a column address strobe signal CASB, and a write enable signal WEB. The chip selecting signal CSB, row address strobe signal RASB, column address strobe signal CASB, and write enable signal WEB may all be inverted signals. For example, an example embodiment of the dummy read command detector 10-1 may generate the dummy read signal DRD if an inverted chip selecting signal CSB has a high level, and an inverted row address strobe signal RASB, inverted column address strobe signal CASB, and an inverted write enable signal WEB having a high level are applied at a rising and/or falling edge of the clock signal CLK. The chip selecting signal CSB, row address strobe signal RASB, column address strobe signal CASB, and write enable signal WEB may or may not be inverted signals and may respond to various signal levels (e.g. high, low, positive, and negative).

An example embodiment of the read command detector 10-2 may generate the read signal RD based on at least one of a chip selecting signal CSB, a row address strobe signal RASB, a column address strobe signal CASB, and a write enable signal WEB. For example, an example embodiment of the read command detector 10-2 may generate the read signal RD if the inverted chip selecting signal CSB has a low level, and the inverted row address strobe signal RASB, inverted column address strobe signal CASB, and inverted write enable signal WEB having a high level are applied at a rising and/or falling edge of the clock signal CLK.

An example embodiment of the mode setting command detector 10-3 may generate the mode setting signal MRS based on at least one of a chip selecting signal CSB, a row address strobe signal RASB, a column address strobe signal CASB, and a write enable signal WEB. For example, an example embodiment of the mode setting command detector 10-3 may generate the mode setting signal MRS if the inverted chip selected signal CSB, the inverted row address strobe signal RASB, the inverted column address strobe signal CASB, and the inverted write enable signal WEB having a low level are applied to an example embodiment of the mode setting command detector 10-3.

In an example embodiment of the command decoder of FIG. 3 each of an example embodiment of the dummy read command detector 10-1, an example embodiment of the read command detector 10-2, and an example embodiment of the mode setting command detector 10-3 share the same clock signal CLK, chip selecting signal CSB, row address strobe signal RASB, column address strobe selecting signal CASB, and write enable signal WEB. In alternative embodiments of the command decoder, the dummy read command detector 10-1, the read command detector 10-2, and the mode setting command detector 10-3 may not share the same clock signal CLK, chip selecting signal CSB, row address strobe signal RASB, column address strobe selecting signal CASB, and write enable signal WEB.

Figure 4A:
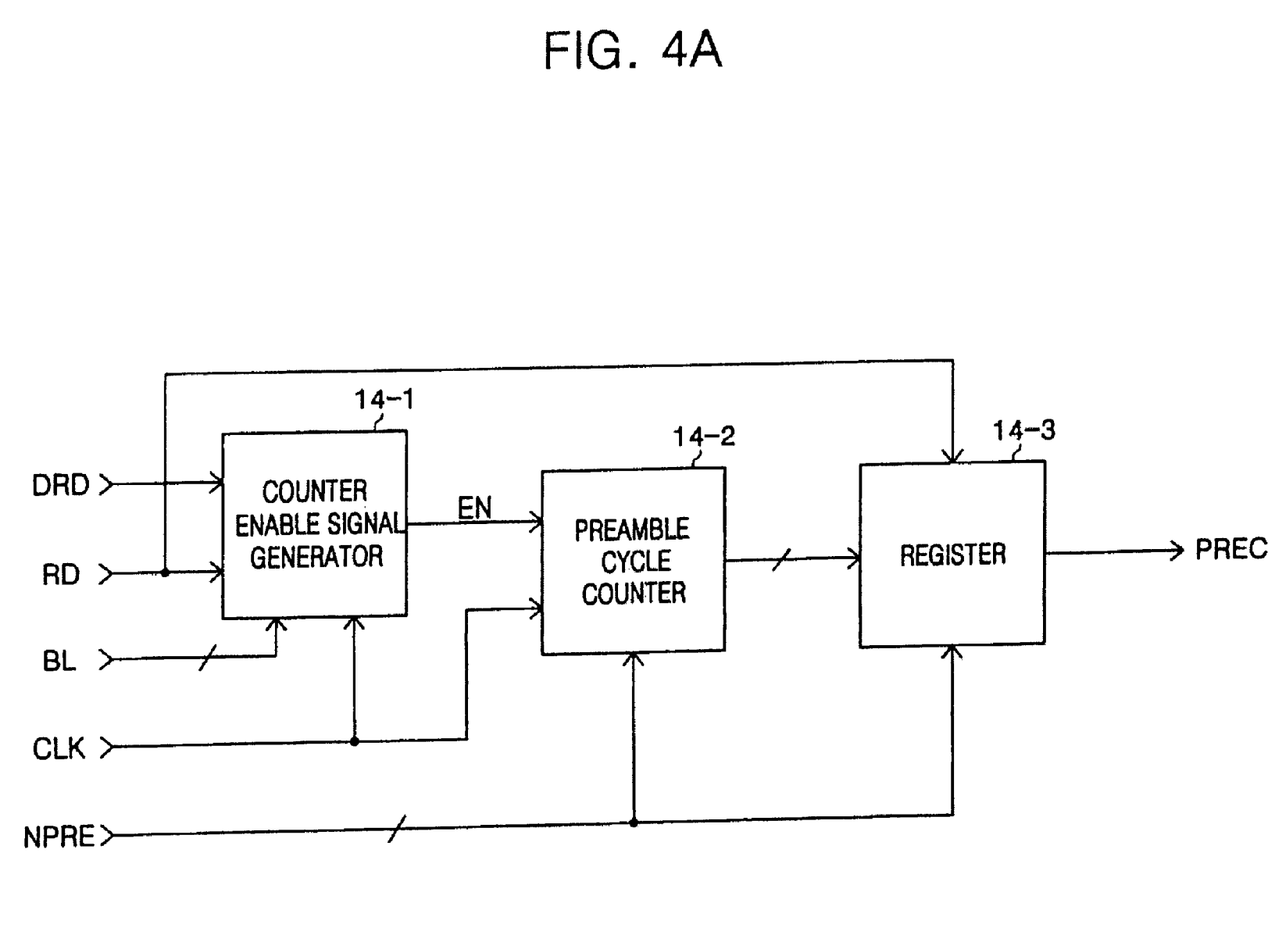
FIG. 4A is a block diagram of an example embodiment of a preamble cycle calculator of the example embodiment of the semiconductor memory device of FIG. 2.

FIG. 4A is a block diagram illustrating an example embodiment of the preamble cycle calculator of an example embodiment of the semiconductor memory device of FIG. 2. An example embodiment of the preamble cycle calculator as shown in FIG. 4A may include a counter enable signal generator 14-1, a preamble counter 14-2, and a register 14-3.

An example embodiment of the counter enable signal generator 14-1 may generate a toggling enable signal EN in response to the dummy read signal DRD and/or the read signal RD. For example, the generated enable signal EN may be delayed during a cycle corresponding to the burst length, may activate if the dummy read signal DRD and/or the read signal RD is input and may deactivate in response to a later (next, for example) dummy read signal DRD and/or read signal RD. The activation and deactivation of the toggling enable signal EN may be in the form of a transition of the toggling enable signal EN from a first level to a second level, wherein the first level may correspond to a high level, and the second level discussed above may correspond to a low level or vice versa.

An example embodiment of the preamble cycle counter 14-2 may activate and/or deactivate in response to the enable signal EN and may perform a counting operation based on the clock signal CLK. Further, an example embodiment of the preamble cycle counter 14-2 may stop counting if a counted value corresponds to a specified preamble cycle number. An example embodiment of the preamble cycle counter 14-2 may be configured to perform the counting operation in a variety of manners. For example, the preamble cycle counter 14-2 may be configured to count up and/or down using constant and/or variable increments depending on the design of the preamble cycle counter 14-2.

An example embodiment of the register 14-3 may be configured to store and generate various values and/or signals. For example, an example embodiment of the register 14-3 may initially store the maximum cycle signal NPRE and/or a value output from an example embodiment of the preamble cycle counter 14-2 in response to the read signal RD, and may generate the preamble cycle signal PREC.

Figure 4B:
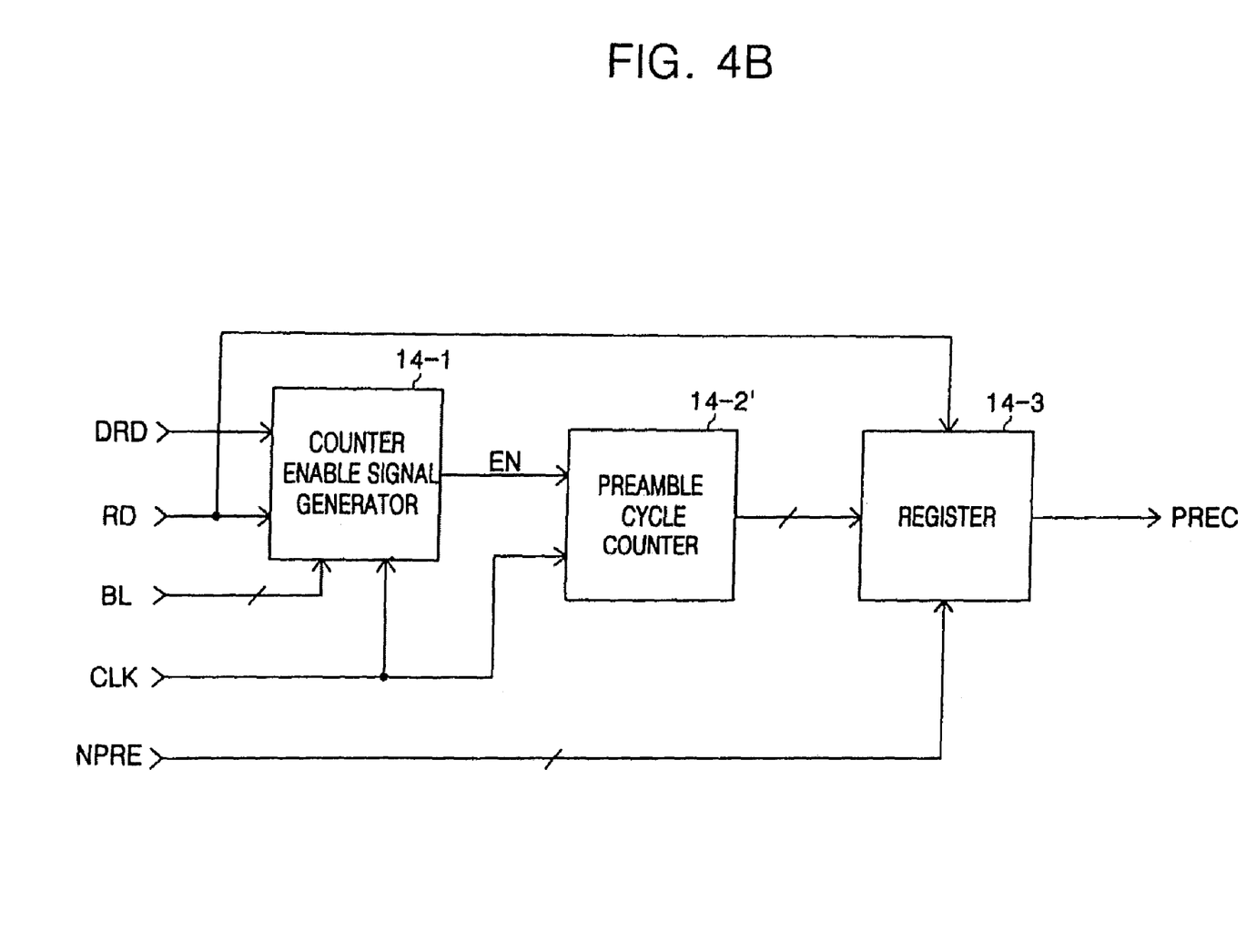
FIG. 4B is a block diagram of an example embodiment of a preamble cycle counter of the example embodiment of the semiconductor memory device of FIG. 2.

FIG. 4B is a block diagram illustrating an example embodiment of the preamble cycle calculator of an example embodiment of the semiconductor memory device of FIG. 2. In FIG. 4B, an example embodiment of the preamble cycle counter 14-2 of FIG. 4A is replaced with an example embodiment of a preamble cycle counter 14-2'. Like reference numerals of FIGS. 4A and 4B denote like parts, and thus a description of the like parts is omitted.

As previously discussed, an example embodiment of the preamble cycle counter 14-2 may be enabled in response to the enable signal EN and may perform a counting operation based on the clock signal CLK. The example embodiment of the preamble cycle counter 14-2' may be configured to count to a predetermined value (e.g., preamble cycle threshold). An example embodiment of the preamble cycle counter 14-2' may be configured to count up and/or down to a predetermined value using constant and/or variable increments.

Figure 5:
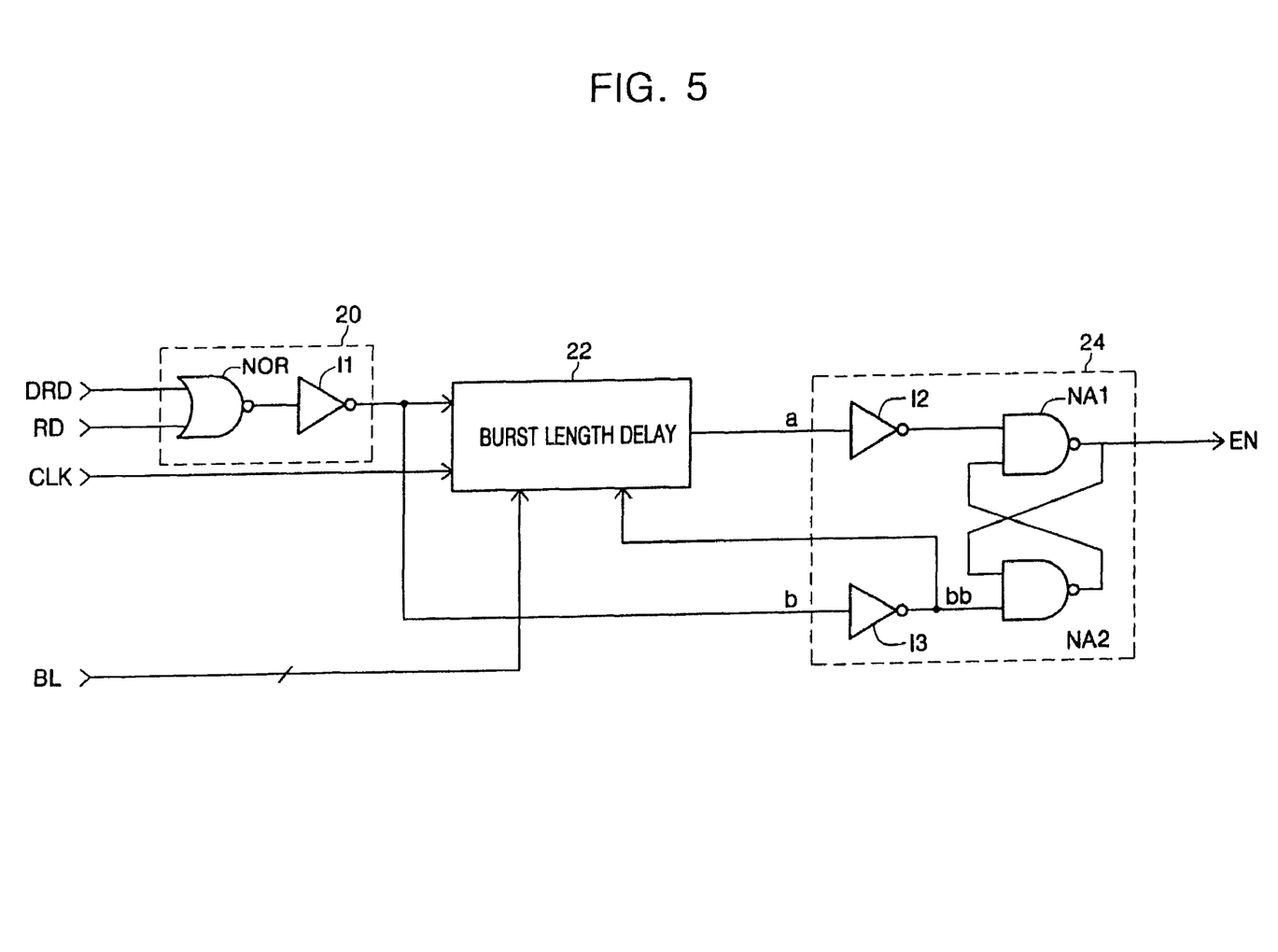
FIG. 5 is a block diagram of an example embodiment of the counting enable signal generator shown in FIGS. 4A and 4B.

FIG. 5 is a block diagram illustrating an example embodiment of the counting enable signal generator shown in FIGS. 4A and 4B. An example embodiment of the counting enable signal generator as shown in FIG. 5 may include a logical sum gate 20, a burst length delay 22, and a latch 24.

An example embodiment of the logical sum gate 20 may include a NOR gate NOR and an inverter I1. An example embodiment of the logical sum gate 20 may sum the dummy read signal DRD and the read signal RD to generate a signal b.

An example embodiment of the burst length delay 22 may delay the output signal b of an example embodiment of the logical sum gate 20 during a number of cycles approximately corresponding to the burst length signal BL, may generate a signal a in response to the clock signal CLK, and may be reset in response to a signal bb. For example, in an example embodiment where the semiconductor memory device operates at a double data rate, a delay may be performed during two cycles if the burst length is four, and a delay may be performed during four cycles if the burst length is eight.

An example of embodiment of the latch 24 may include inverters I2 and I3 and NAND gates NA1 and NA2. An example embodiment of the latch 24 as illustrated in FIG. 5 may activate the enable signal EN when the signal a is activated and may deactivate the enable signal EN if the signal b is activated.

Alternative, embodiments of the latch may be configured to deactivate the enable signal EN when the signal a is deactivated and may activate the enable signal EN if the signal b is deactivated (for example). The signals a and b may be determined to be activated and/or deactivated based on the level of the respective signals. For example, the signal a may be determined to be activated if signal a corresponds to a first level and may be considered deactivated if the signal a corresponds to a second level. The first level of signal a may correspond to a high level and the second level of signal a may correspond to a low level or vice versa.

Figure 6:
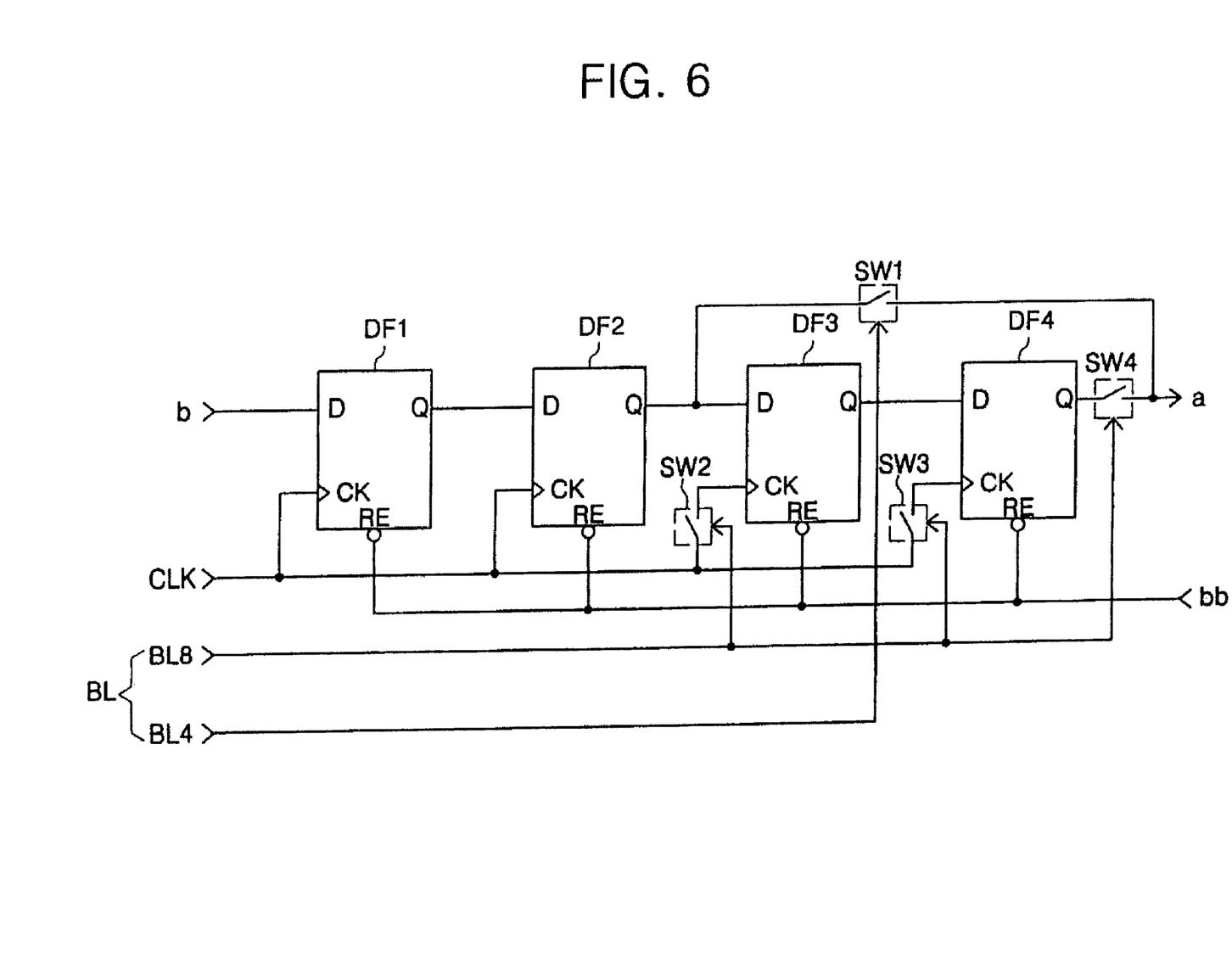
FIG. 6 is a block diagram of an example embodiment of the burst length delay shown in FIG. 5.

FIG. 6 is a block diagram illustrating an example embodiment of the burst length delay shown in FIG. 5. An example embodiment of the burst length delay of FIG. 6 may include D flip flops DF1 to DF4 and switches SW1 to SW4. According to an example embodiment of the present invention, the burst length may be varied. For example, if the burst length is set to four, the burst length signal BL4 may have a high level, and if the burst length is set to eight, the burst length signal BL8 may have a high level. Further, if the burst length signal BL4 has a high level and the burst length signal BL8 has a low level, the switch SW1 may be turned on, and the switches SW2 to SW4 may be turned off. Accordingly, the D flip flops DF1 and DF2 may operate to delay the signal b during two cycles to generate the signal a and may be reset in response to the signal bb.

According to a second example, if the burst length signal BL4 has a low level and the burst length signal BL8 has a high level, the switch SW1 may be turned off, and the switches SW2 to SW4 may be turned on. Accordingly, the four D flip flops DF1 to DF4 may delay the signal b during four cycles to generate the signal a in response to the clock signal CLK and may be reset in response to the signal bb.

Figure 7A:
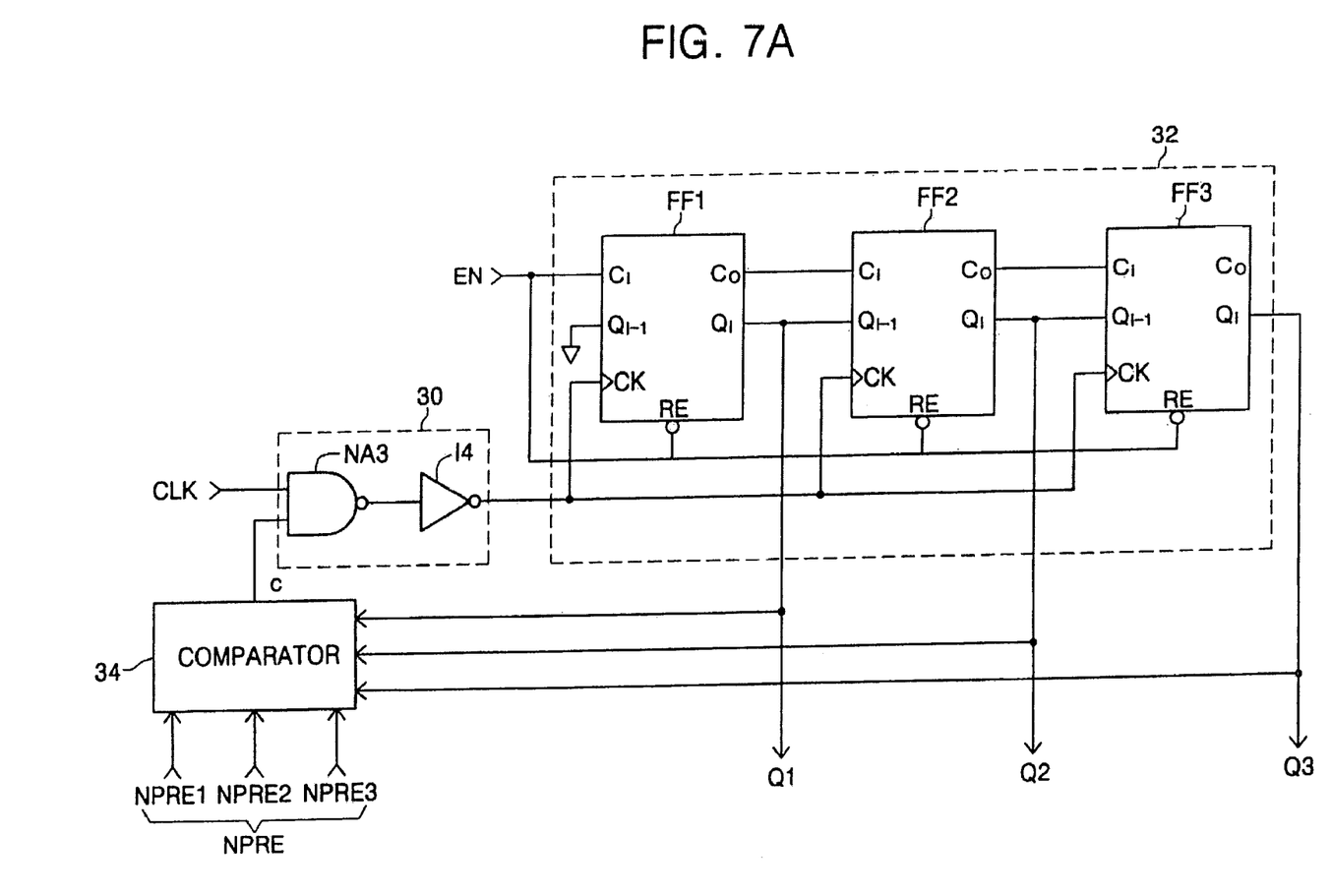
FIG. 7A is a block diagram of an example embodiment of the preamble cycle counter shown in FIG. 4A.

FIG. 7A is a block diagram illustrating an example embodiment of the preamble cycle counter shown in FIG. 4A. An example embodiment of the preamble cycle counter may include a logical product gate 30, a counter 32, and a comparator 34.

An example embodiment of the logical product gate 30 may include a NAND gate NA3 and an inverter I4. An example embodiment of the logical product gate 30 may generate the clock signal CLK in response to the signal c.

An example embodiment of the counter 32 may include flip flops FF1 to FF3. An example embodiment of the counter 32 may be reset in response to the enable signal EN. According to an example embodiment in FIG. 7A, if an enable signal EN having a high level is generated, the counter 32 may perform a counting operation to generate a 3-bit signal Q1 to Q3 in response to the output signal of the logical product gate 30. The 3-bit signal Q1 to Q3 may correspond to the preamble cycle number.

An example embodiment of the comparator 34 may generate the signal c having a low level if the 3-bit signal Q1 to Q3 corresponds to the maximum preamble cycle signal NPRE1, NPRE2 and NPRE3. For example, if an example embodiment of the comparator 34 generates the signal c having a low level, the output signal of the logical product gate 30 has a low level, and thus the flip flops FF1 to FF3 may not count. As a result, the signal Q1 to Q3 may hold the previous signal Q1 to Q3 until the enable signal EN is disabled (e.g., a low signal level). The signal Q1 to Q3 may be reset to a low level if the enable signal EN is disabled (e.g., a low signal level). For example, if the maximum preamble cycle signal NPRE is "101", an example embodiment of the counter 32 may count to "101" in response to the clock signal CLK while the enable signal EN maintains a high level, and thereafter maintain "101" because the clock signal CLK is not generated due to the effect of an example embodiment of the comparator 34 on an example embodiment of the logical product gate 30 which generates the clock signal CLK. If the enable signal EN is disabled (e.g., a low level), the signal Q1 to Q3 may be reset to "000", for example.

Figure 7B:
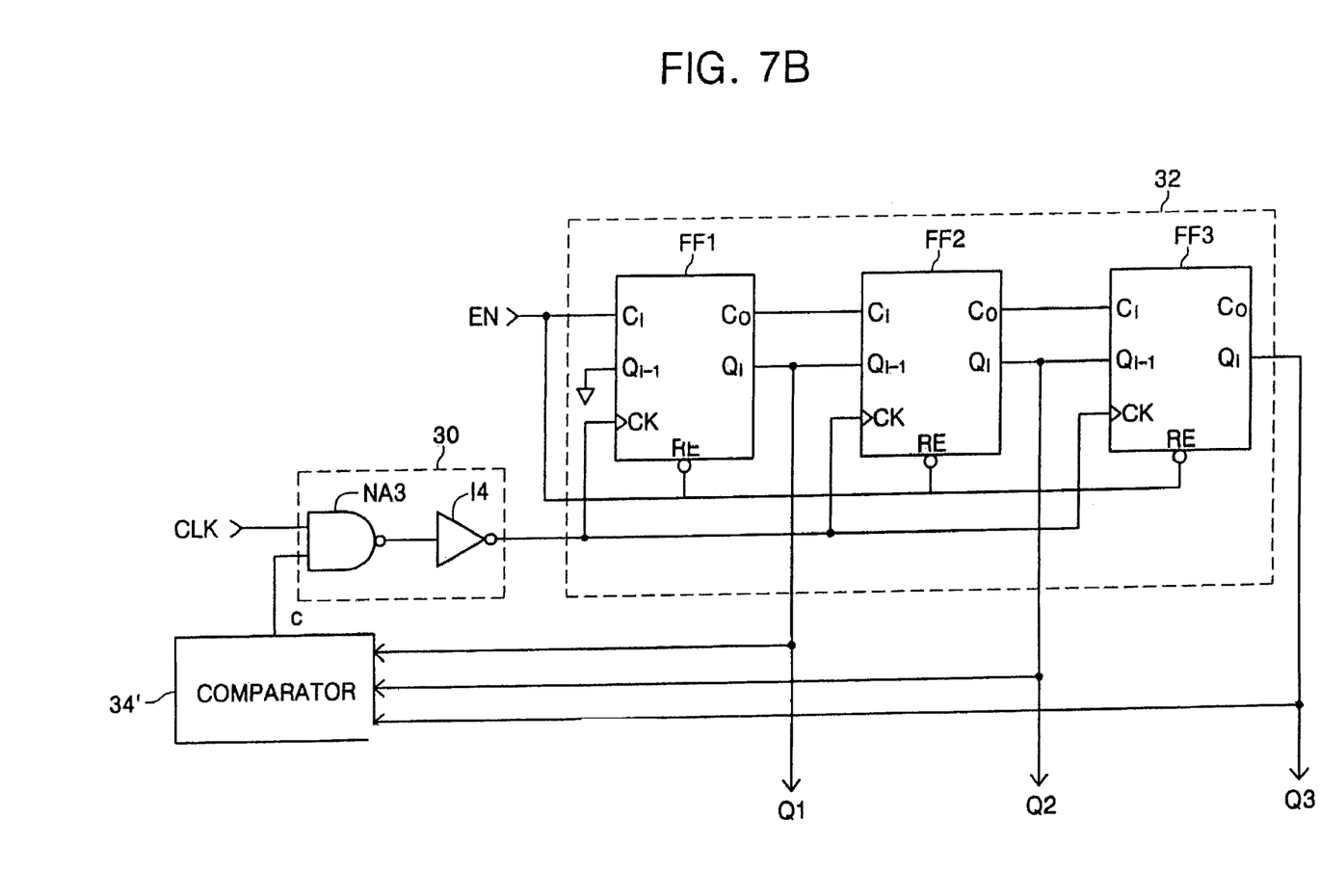
FIG. 7B is a block diagram of an example embodiment of the preamble cycle counter shown in FIG. 4B.

In FIG. 7B, an example embodiment of the comparator 34 of FIG. 7A is replaced with an example embodiment of a comparator 34'. Like reference numerals of FIGS. 7A and 7B denote like parts, and thus the description of the like parts is omitted.

An example embodiment of the comparator 34' may generate the signal c having a low level if the 3-bit signal Q1 to Q3 has a predetermined value. For example, if the 3-bit signal Q1 to Q3 corresponds to "101" or "110", an example embodiment of the comparator 34' may be designed to detect "101" or "110" to generate the signal c having a low level. An example embodiment of comparator 34' may include simple logical gates such as an inverter or a NAND gate.

Figure 8:
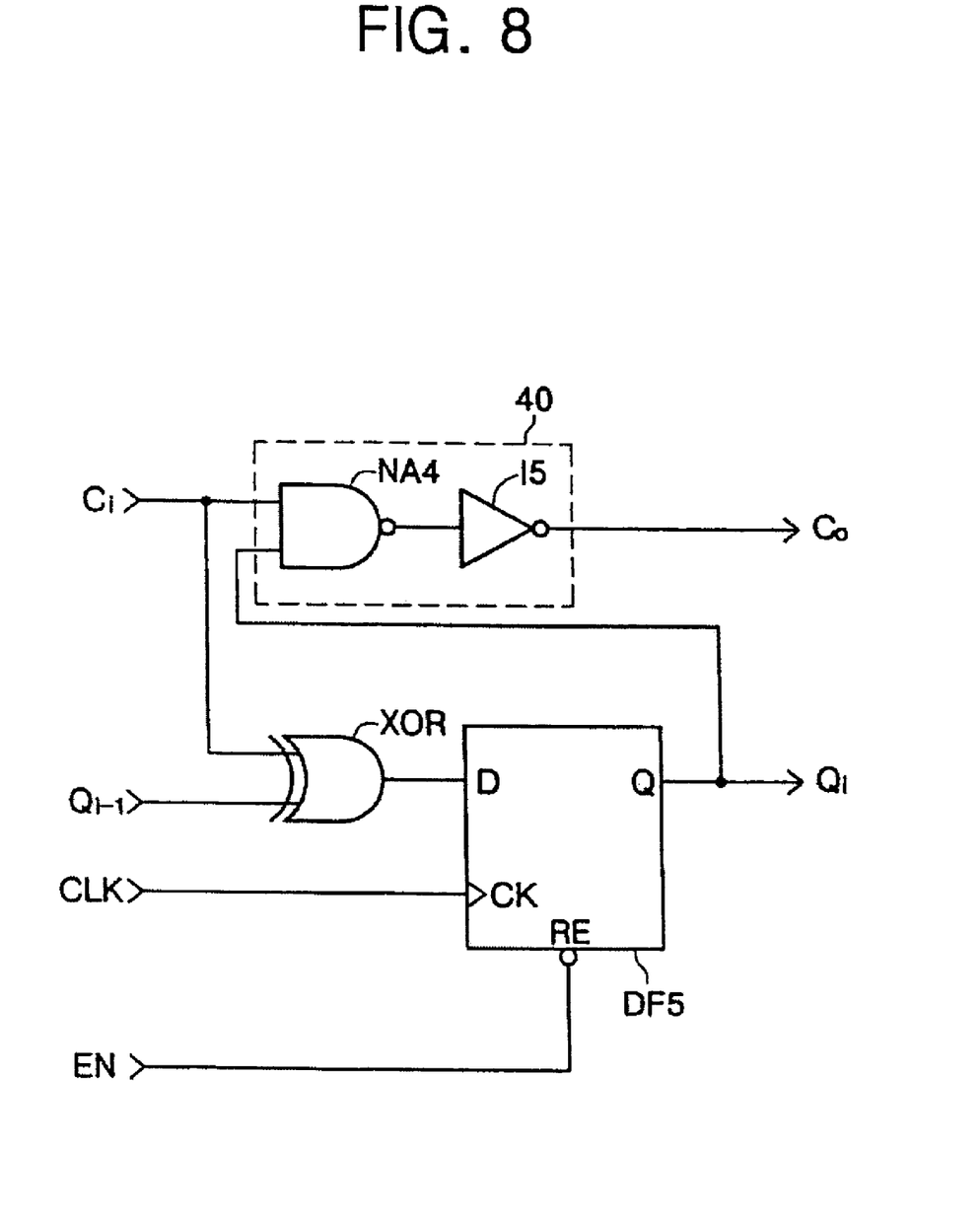
FIG. 8 is a block diagram of an example embodiment of the flip flop shown in FIGS. 7A and 7B.

FIG. 8 is a diagram illustrating an example embodiment of a flip flop shown in FIGS. 7A and 7B. An example embodiment of the flip flop, as shown in FIG. 8, may include a logical product gate 40, an XOR gate XOR, and a D flip flop DF5.

An example embodiment of the logical product gate 40 may include a NAND gate NA4 and an inverter I5. An example embodiment of the logical product gate 40 may AND signals applied to an input terminal Ci and a counting output terminal Qi to generate an output signal at an output terminal Co.

The XOR gate XOR may XOR the input terminal Ci and a counting input terminal Qi-1 and may generate a signal having a low level if the two signals are the same and may generate a signal having a high level if the two signals are different.

The D flip flop DF5 may be reset in response to a falling edge of the enable signal EN applied to the reset terminal RE and may latch an output signal of the XOR gate to be output to the counting output terminal Qi in response to the clock signal CLK. The example embodiment of the flip flop of FIG. 8 may generate a signal having a high level to the output terminal Co if signals having a high level are applied to the input terminal Ci and the counting output terminal Qi, and may latch a signal having a high level to generate a counting output signal Qi having a high level in response to the clock signal CLK if a signal applied to the input terminal Ci and a signal applied to the counting input terminal Qi-1 are different.

FIGS. 5-8 illustrate example embodiments of the present invention using specific logical operators (e.g., inverters I1-I5, D flip flops DF1-DF4, etc.). However, it should be understood that various logical operators and combinations thereof could be used, and therefore FIGS. 5-8 are example embodiments of the present invention and are not intended to limit the present invention.

Figure 9:
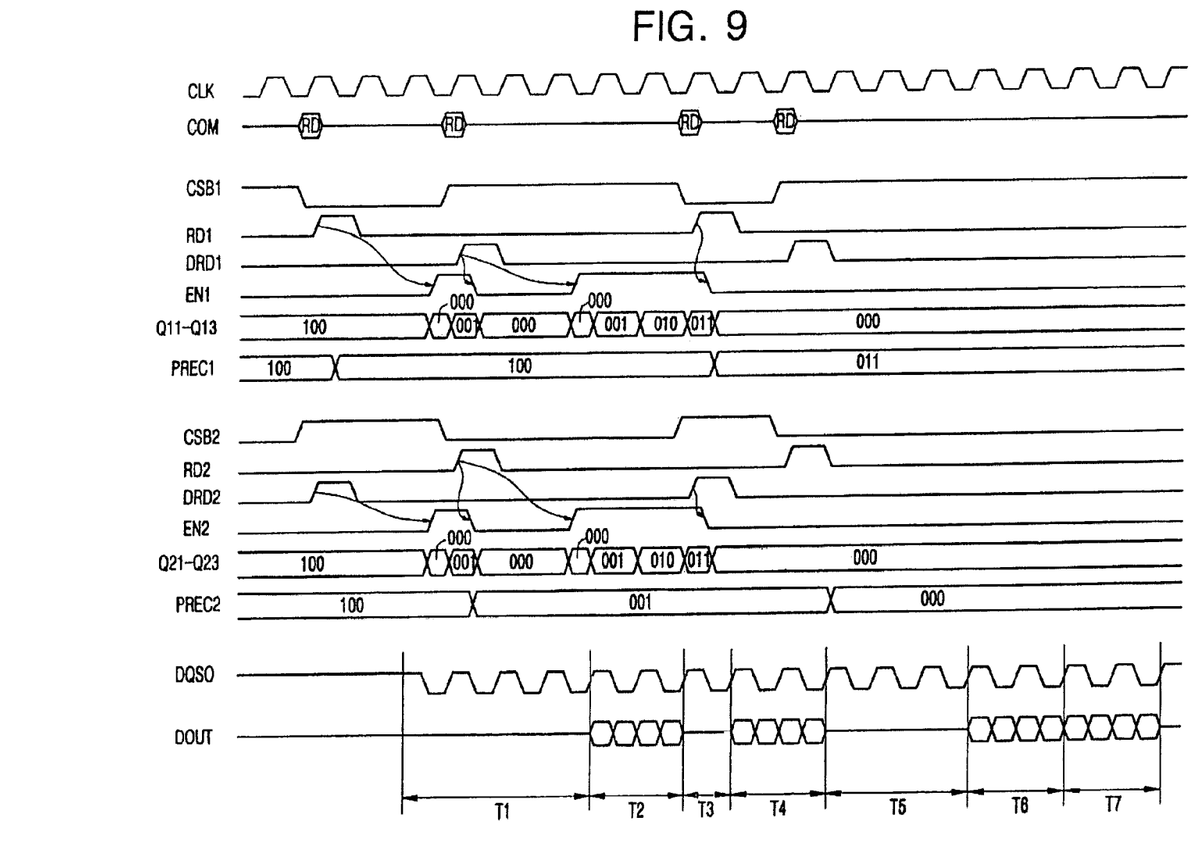
FIG. 9 is an example timing diagram illustrating operation of an example embodiment of the present invention.

FIG. 9 is a timing diagram illustrating operation of an example embodiment of a semiconductor memory device according to the present invention. In particular, FIG. 9 shows operation of an example embodiment of the semiconductor memory device where an example embodiment of the memory controller 100 is connected to the example embodiments of the semiconductor memory devices 200-1 and 200-2. The example embodiments of the semiconductor memory devices operate at a double data rate, the CAS latency may be set to six, the burst length may be set to four, and the maximum preamble cycle signal NPRE may be set to "100".

In FIG. 9, CLK and COM may denote a clock signal and a command signal, respectively, which may be commonly applied to example embodiments of the semiconductor memory devices 200-1 and 200-2. CSB1 may denote an inverted chip selecting signal applied to an example embodiment of the semiconductor memory device 200-1, and CSB2 may denote an inverted chip selecting signal applied to the semiconductor memory device 200-2. RD1, DRD1, EN1, Q11 to Q13, and PREC1 may denote signals internally generated by an example embodiment of the semiconductor memory device 200-1, and RD2, DRD2, EN2, Q21 to Q23, and PREC2 may denote signals internally generated by an example embodiment of the semiconductor memory device 200-2. DQSO and DOUT may denote an output data strobe signal and output data output from the example embodiments of the semiconductor memory devices 200-1 and 200-2, respectively.

According to the timing diagram in FIG. 9 representing an example embodiment of the present invention, the inverted chip selecting signal CSB1 and the command signal COM, which may designate a read command, having a low level are applied at a rising edge of the clock signal, an example embodiment of the command decoder 10 of an example embodiment of the semiconductor memory device 200-1 may generate the read signal RD1, and an example embodiment of the command decoder 10 of an example embodiment of the semiconductor memory device 200-2 may generate the dummy read signal DRD2. An example embodiment of the register 14-3 of an example embodiment of the semiconductor memory device 200-1 may receive the signal Q11 to Q13 whose set initial value may be "100" output from an example embodiment of the preamble cycle counter 14-2 or 14-2' to generate the signal Q11 to Q13 as the preamble cycle signal PREC1 in response to the read signal RD1.

Thus, an example embodiment of the semiconductor memory device 200-1 may generate a preamble signal of four cycles during a time period T1 and may generate the output data DOUT together with the strobe signal during a time period T2.

An example embodiment of the counter enable signal generator 14-1 of each of the example embodiments of the semiconductor memory devices 200-1 and 200-2 may activate the enable signals EN1 and EN2 after the delay of a cycle corresponding to the burst length, e.g., two cycles. An example embodiment of the preamble cycle counter 14-2 or 14-2' of each of the example embodiments of the semiconductor memory devices 200-1 and 200-2 may perform a counting operation in response to the clock signal CLK. After three cycles have lapsed after a command signal COM, which may designate a first read command is applied, if the inverted chip selecting signal CSB2 and the command signal COM, which may designate the read command, having a low level are applied at a rising edge of the clock signal CLK, an example embodiment of the command decoder 10 of an example embodiment of the semiconductor memory device 200-2 may generate the read signal RD2, and an example embodiment of the command decoder 10 of an example embodiment of the semiconductor memory device 200-1 may generate the dummy read signal DRD1. Thus, an example embodiment of the counter enable signal generator 14-1 of each of an example embodiment of the semiconductor memory devices 200-1 and 200-2 may deactivate the enable signals EN1 and EN2. An example embodiment of the preamble cycle counter 14-2 or 14-2' of each of the example embodiment of the semiconductor memory devices 200-1 and 200-2 may stop the counting operation and may generate the signal Q11 to Q13 of "001". The register 14-3 of an example embodiment of the semiconductor memory device 200-2 may receive the signal of "001" to generate the preamble cycle signal PREC2 in response to the read signal RD2. Because the read signal RD2 may be enabled after three cycles from the dummy read signal DRD2 and the burst length BL may be four corresponding to two cycles, the preamble cycle may be one cycle which is obtained by subtracting two cycles from three cycles.

Thus, an example embodiment of the semiconductor memory device 200-2 may generate the preamble signal of one cycle during a time period T3 and may generate the output data DOUT together with the strobe signal during a time period T4.

According the above described example operation of an example embodiment of the present invention, an example embodiment of the semiconductor memory device 200-1 may generate the preamble signal of three cycles because the preamble cycle signal PREC1 of "011" is generated during a time period T5 and may generate the output data DOUT together with the strobe signal during a time period T6. Since the read signal RD1 is enabled after five cycles from the dummy read signal DRD1 and the burst length BL is four corresponding to two cycles, the preamble cycle is three cycles which is obtained by subtracting two cycles from five cycles. During time period T7, an example embodiment of the semiconductor memory device 200-2 does not generate the preamble signal because the preamble cycle signal PREC2 of "000" and generates the output data DOUT together with the strobe signal. The strobe signal of the time period T7 becomes the preamble signal of the semiconductor memory device 200-2, so that the output data DOUT output from an example embodiment of the semiconductor memory device 200-2 during the time period T6 coincides in timing with the strobe signal. Since the read signal RD2 is enabled after two cycles from the dummy read signal DRD2 and the burst length BL is four corresponding to two cycles, the preamble cycle is zero cycles, which is obtained by subtracting two cycles from two cycles.

An example embodiment of the memory controller 100 may continuously apply the read command to the semiconductor memory devices 200-1 and 200-2 with a delay time of a cycle corresponding to the burst length. Thus, efficiency of the data bus may be improved.

As shown in the example operation timing diagram of FIG. 9, in example embodiments of the memory system of the present invention, a preamble cycle may be varied so that collision between the strobe signal and the preamble signal output from the two example embodiments of the semiconductor memory devices 200-1 and 200-2 may not occur.

In the above described example embodiments, the memory controller 100 may be connected to the two semiconductor memory devices 200-1 and 200-2. However, the teachings of the example embodiments of the present invention may be applied to example embodiments where the memory controller is connected to the three or more semiconductor memory devices.

In an example embodiment of the output data strobe signal generating method of the example embodiment of the semiconductor memory device, an example embodiment of the semiconductor memory device operates at a double data rate, quadruple data rate, etc. and the burst length may be varied (e.g., 4, 6, 8, etc.). However, the teachings of the example embodiments of the present invention may be applied to a case where the semiconductor memory device operates at a single or guard data rate and the burst length is fixed. For example, in case where the burst length is fixed, an example embodiment of the present invention may be achieved such that the burst length delay of FIG. 5 may be designed to delay during a cycle corresponding to the fixed burst length.

In the above described example embodiments of the present invention, the example embodiments of the memory controller is connected to a plurality of semiconductor memory devices. However, the present invention may be applied to an example embodiment, wherein an example embodiment of the memory controller is connected to a memory module. If an example embodiment of the memory controller is connected to a dual rank memory module, only the chip selecting signal may be applied to front and rear portions of the module through different lines, respectively, and the other signals may be transmitted between an example embodiment of the memory controller and the front and rear portions of the module through a common line.

As previously described, an example embodiments of the memory system of the present invention may reduce or prevent collision between the strobe signal generated from one example embodiment of the semiconductor memory device and the preamble signal generated from another example embodiment of the semiconductor memory device such that each of a plurality of example embodiments of the semiconductor memory devices may detect the read operation of other example embodiments of semiconductor memory devices to thereby vary the number of the preamble cycles.

Example embodiments of the semiconductor memory device according to the present invention and the example embodiments of the output data strobe signal generating method thereof may increase efficiency of a data bus.

What is claimed is:

1. A semiconductor memory device, comprising:
a command decoder configured to decode a read signal, a dummy read signal, and a mode setting signal;
a mode setting portion configured to set a burst length signal and a CAS latency signal in response to the mode setting signal; and
a preamble cycle calculator configured to generate a preamble cycle signal based on a calculated preamble cycle number.

2. The device of claim 1, wherein the calculated preamble cycle number is calculated by subtracting a cycle number corresponding to the burst length from a cycle number representing a number of cycles occurring between the dummy read signal and the read signal.

3. The device of claim 2, wherein the semiconductor memory device further includes an output data strobe signal generator configured to generate an output data strobe signal in response to the read signal, delay the generated output data strobe signal based on the CAS latency signal and generate a strobe signal of the output data strobe signal.

4. The device of claim 2, wherein the command decoder generates the read signal if a chip selecting signal is activated and a command signal designates a read command and generates the dummy read signal if the chip selecting signal is deactivated and the command signal designates a read command.

5. The device of claim 2, wherein the preamble cycle calculator includes an enable signal generator configured to generate an enable signal which is delayed for a number of cycles based on the burst length, is activated in response to one of the dummy read signal and the read signal and is deactivated in response to a following one of the dummy read signal and the read signal;
a preamble cycle counter configured to perform a counting operation in response to a clock signal if the enable signal is activated and to stop the counting operation to generate the preamble cycle number if the enable signal is deactivated; and
a register configured to store the preamble cycle number and output the preamble cycle signal.

6. The device of claim 2, wherein the mode setting portion is further configured to set a preamble cycle threshold in response to the mode setting signal.

7. The device of claim 6, wherein the preamble cycle counter stops the counting operation if the preamble cycle number becomes the preamble cycle threshold.

8. The device of claim 7, wherein the register initially stores the preamble cycle threshold, stores the calculated preamble cycle number in response to the read signal, and outputs the preamble cycle signal.

9. The device of claim 5, wherein the enable signal generator includes:
a logical sum gate configured to logically sum the dummy read signal and the read signal;
a burst length delay configured to delay an output signal of the logical sum gate for a number of cycles corresponding to the burst length signal; and
a latch configured to generate the enable signal which is activated if an output signal of the burst length delay is activated and deactivated if an output signal of the logical sum gate is activated.

10. The device of claim 9, wherein the burst length delay includes a number of D flip flops which are cascade-connected, and the D flip flops are configured to reset if the output signal of the logical sum gate is activated.

11. The device of claim 6, wherein the preamble cycle counter includes:
- a first logical product gate configured to generate the clock signal in response to a comparison signal;
- a counter configured to enable if the enable signal is activated, perform the counting operation to generate the calculated preamble cycle number in response to an output signal of the first logical product gate, and reset if the enable signal is deactivated; and
- a comparator configured to compare the calculated preamble cycle number with the preamble cycle threshold and generate the comparison signal.

12. The device of claim 11, wherein the counter includes a number of flip flops which are cascade-connected and configured to perform the counting operation in response to the output signal of the first logical product gate.

13. The device of claim 12, wherein each of the cascade-connected flip flops includes:
- a second logical product gate configured to AND an input signal and a counting output signal to generate an output signal;
- an XOR gate configured to XOR the input signal and a counting input signal; and
- a D flip flop configured to latch an output signal of the XOR gate to generate as the counting output signal in response to the clock signal,
- wherein the enable signal is applied to a first one of the cascade-connected flip flops as the input signal, a ground voltage is applied as a counting input signal of the first one of the cascade-connected flip flops, and an output signal and a counting output signal of a prior cascade-connected flip flop are applied as an input signal and a counting input signal of a following cascade-connected flip flop.

14. An output data strobe signal generating method comprising:
- generating a read signal, a dummy read signal, and a mode setting signal in response to a command signal and a chip selecting signal;
- setting a burst length signal, a CAS latency signal and a preamble cycle signal in response to the mode setting signal;
- calculating a preamble cycle number; and
- generating a preamble cycle signal based on the calculated preamble cycle number.

15. The method of claim 14, wherein calculating the preamble cycle number includes subtracting a cycle number corresponding to the burst length from a cycle number representing a number of cycles occurring between the dummy read signal and the read signal.

16. The method of claim 15, further comprising:
- generating an output data strobe signal in response to the read signal;
- delaying the generated output data strobe signal for a number of cycles corresponding to the CAS latency signal;
- and generating a strobe signal of the output data strobe signal.

17. The method of claim 15, wherein generating the read signal, the dummy signal, and the mode setting signal includes generating the read signal if the chip selecting signal is activated and the command signal designates a read command, and generating the dummy read signal if the chip selecting signal is deactivated and the command signal designates a read command.

18. The method of claim 17, wherein generating the preamble signal based on the calculated preamble cycle number includes:
- generating an enable signal which is delayed for a number of cycles corresponding to the burst length signal, activated in response to one of the dummy read signal and the read signal, and deactivated in response to a following one of the dummy read signal and the read signal;
- performing a counting operation in response to a clock signal if the enable signal is activated;
- stopping the counting operation if the calculated preamble cycle number becomes the preamble cycle threshold, ; and
- storing the preamble cycle signal threshold and the calculated preamble cycle number; and
- generating the preamble cycle signal.

* * * * *